United States Patent [19]

Coppock

[11] 4,377,339
[45] Mar. 22, 1983

[54] PROJECTION OPTICAL LITHOGRAPHY APPARATUS

[75] Inventor: Richard A. Coppock, San Jose, Calif.

[73] Assignee: GTE Products Corporation, Stamford, Conn.

[21] Appl. No.: 289,129

[22] Filed: Aug. 3, 1981

[51] Int. Cl.³ .................. G03B 27/32; G03B 27/52
[52] U.S. Cl. .................................. 355/27; 355/39; 355/45
[58] Field of Search ................ 355/27, 28, 45, 77, 355/39, 43

[56] References Cited

U.S. PATENT DOCUMENTS 3,115,815 12/1963 Friedel ......................... 355/27 X Primary Examiner—Richard A. Wintercorn
Attorney, Agent, or Firm—John F. Lawler

[57] ABSTRACT

In a printed circuit formation process, a positive photoresist layer on a semiconductor substrate surface is exposed to light in a projection exposure system through a transparent liquid-gate which has an index of refraction $n_L$ closer to the index of refraction $n_R$ of the resist layer than is the index of refraction of air. This reduces reflection of light from the resist layers and thus minimizes standing waves in the layer, which waves produce a deleterious layered resist structure and require critical dependence of exposure time on absolute resist thickness. By using photo developer liquid in the gate as the index matching medium together with a reflex viewing system, visual monitoring of the expose/develop process in real time is realized.

1 Claim, 3 Drawing Figures

PROJECTION OPTICAL LITHOGRAPHY APPARATUS

BACKGROUND OF THE INVENTION

This invention relates to optical lithography and more particularly to an improved apparatus for projection printing with imaging optics in the production of printed circuits and the like.

Photoresist exposure, in the integrated circuit industry for example, is accomplished by contact printing with collimated light or by projection printing with imaging optics. In contact printing procedures, a light source is incident on a lens system designed primarily to collimate the source. The collimated source exposes a resist-coated wafer or substrate through a patterned mask with which the wafer is in contact. With a projection system, the mask and wafer are physically separated. The function of the lenses in the latter system is to project an image of the illuminated mask onto the wafer surface. Projection printing is particularly popular for step-and-repeat processes, eliminates mask wear, and relaxes mask resolution requirements when minifying optics are employed.

Since projection lenses are usually designed to yield state-of-the-art performance for geometrical distortion and resolution, they operate over a restricted spectral range, such as a single filtered strong line from light source such as a mercury arc lamp. This produces optical standing waves in the resist layer during exposure resulting in a layered resist structure. In addition, there is critical dependence of required exposure time on the absolute resist thickness thereby necessitating tight control of resist thickness.

This invention is directed to apparatus for projection printing on photoresist layers which eliminate standing waves in the layer.

OBJECTS AND SUMMARY OF THE INVENTION

A general object of the invention is the provision of an optical projection system which permits exposure of a photoresist layer while minimizing creation of optical standing waves in the layer.

A further object is the provision of a method of exposing and developing a photoresist layer in a projection printing system by simultaneously exposing and developing the photoresist layer while monitoring progress of the steps in real time.

These and other objects of the invention are achieved with a projection printing system in which the photoresist layer on the substrate is exposed to light from an imaging mask through a transparent liquid-gate consisting of developer fluid having an index of refraction $n_L$ which is closer to the index of refraction $n_R$ of the photoresist layer than is the index of refraction of air. A reflex viewing device aligned with the photoresist layer permits visual monitoring of the expose-develop process in real time for accurate determination of completion of the process.

DESCRIPTION OF PREFERRED EMBODIMENT

Figure 1:
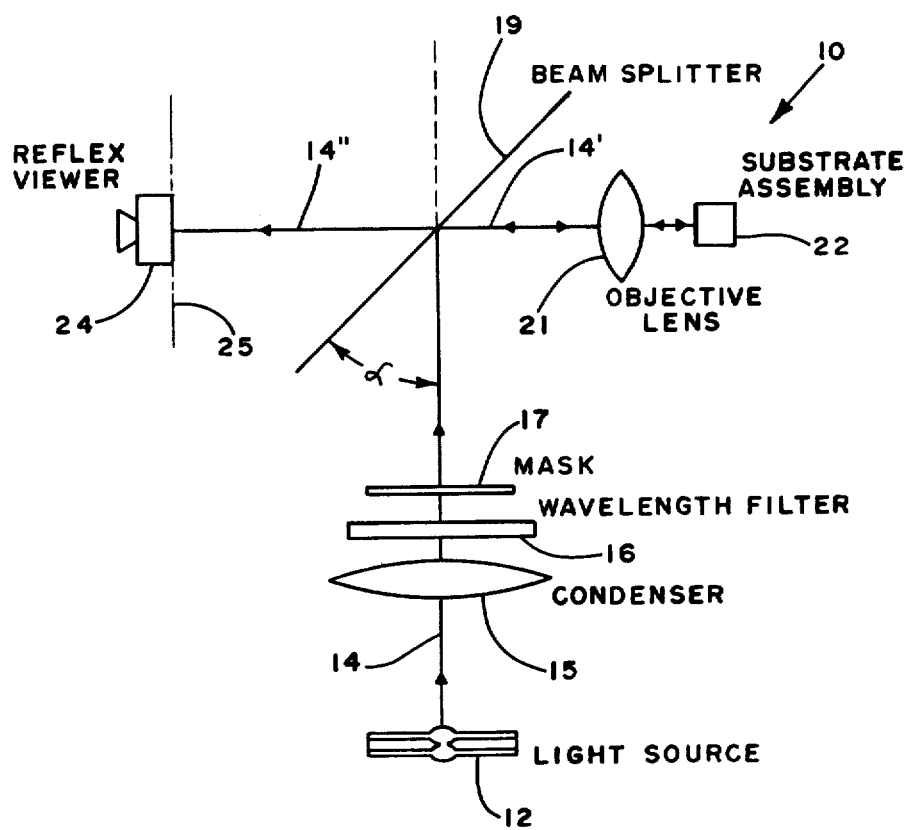
FIG. 1 is a schematic representation of an optical system embodying this invention.

Referring now to the drawings, a projection printing system 10 useful in making printed circuits and embodying this invention comprises a light source 12, such as a mercury arc lamp, aligned along an optical axis 14 with a condenser lens 15, a wavelength filter 16, a mask 17 on which is formed the image of a circuit, for example, to be projected, a beamsplitter 19 such as a partially transmissive-partially reflective plane mirror disposed at an angle α to axis 14, an objective lens 21 and a substrate assembly 22. The beamsplitter transmission/reflection ratio is such that a substantial portion of the light from source 12 is reflected along optical axis 14' toward substrate assembly 22 while the balance of the light passes through the beamsplitter as indicated in broken lines on the drawing.

A reflex viewer 24 having an imaging plane 25 is positioned on the side of beamsplitter 19 opposite from substrate assembly 22 and is directly aligned with the latter along an extension 14" of optical axis 14'. The spacings of viewer imaging plane 25 and mask 17 from beamsplitter 19 are equal.

In operation, light from source 12 is focussed by condenser lens 15 through filter 16 and mask 17. Light from mask 17 is reflected by beamsplitter 19 through objective lens 21 which focusses the mask image on substrate assembly 22 and more particularly on a photosensitive surface of the assembly as described below. Light is reflected from substrate assembly 22 along optical axis 14' and passes through the beamsplitter and along axis 14" to reflex viewer 24 through which visual observation of the expose/develop process of the substrate assembly in real time takes place. Since the distances from beamsplitter 19 of mask 17 and imaging plane 25 of viewer 24 are equal, imaging plane 25 and mask 17 are optically coplaner permitting visual monitoring of changes taking place on the photosensitive surface of interest on the substrate assembly without the necessity of complex and expensive mechanical prealighment procedures.

Figure 2:
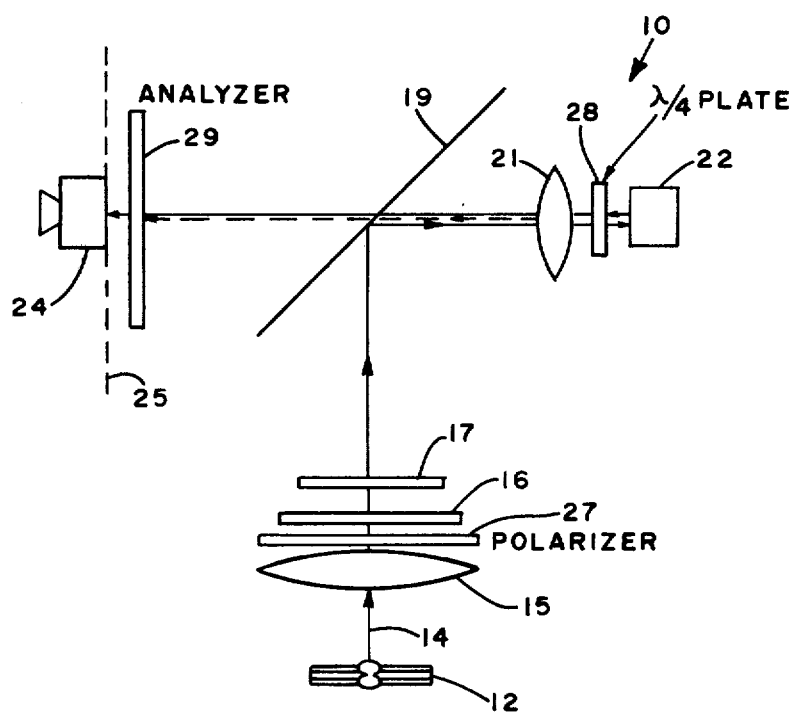
FIG. 2 is a schematic view of part of FIG. 1 modified to prevent reflection of unwanted light to the monitoring device.

In order to improve the quality of viewing of the substrate from viewer 24, the system may be modified to eliminate light reflected from lens 21 to the viewer and thus improve the retro-image contrast at the substrate surface. This objective is achieved by polarization discrimination provided by a polarizer plate 27, see FIG. 2, between condenser lens 15 and filter 16, a quarter-wave plate 28 between objective lens 21 and substrate assembly 22, and an analyzer plate 29 between beamsplitter 19 and viewer 25 and adjacent to the latter. With these elements, light from source 12 propagating along axis 14 is polarized into a plane by plate 27, is reflected from beamsplitter 19 through objective lens 21 and quarter-wave plate 28 and becomes circularly polarized before impinging on the active surface of substrate assembly 22. Light reflected from assembly 22 again passes through plate 28, is reconverted to plane polarization but orthogonal to the original polarization, and passes through analyzer plate 29 which is polarized parallel to the orthogonally polarized light. However, light reflected from lens 21 (shown in broken line in FIG. 2) is blocked by analyzer plate 29. This technique of discriminating against undesired reflected light is not, per se, part of this invention but contributes to achievement of the overall objective of efficient glareless monitoring of the exposure and development of the photosensitive surface of substrate assembly 22.

Figure 3:
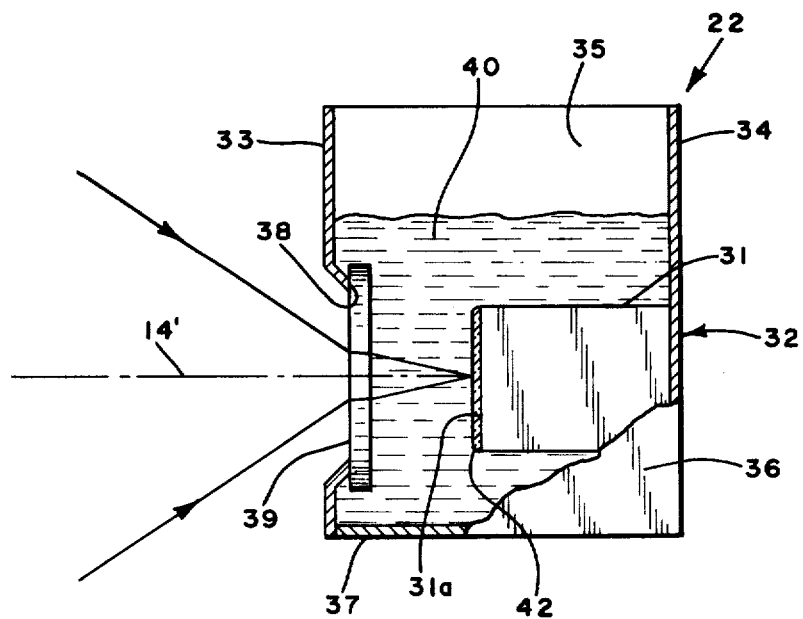
FIG. 3 is an enlarged schematic view of the substrate assembly embodying this invention.

Substrate assembly 22, see FIG. 3, comprises a substrate 31 within a container 32 having a front wall 33, a rear wall 34 on which substrate 31 preferably is mounted, side walls 35 and 36 and a bottom wall 37. Front wall 33 has an opening 38 sealed by a transparent window 39. Container 32 is filled with a transparent liquid 40 preferably comprising a developer fluid such as Type AZ-1350 sold by Shipley Co., Newton, Mass., used for developing exposed positive photoresist layers. Liquid 40 covers photoresist layer 42 and is in contact therewith.

Substrate 31 typically is a crystal body and has a front surface 31a covered by a thin layer 42 of photosensitive material which is a positive photoresist such as Type AZ-1350J manufactured by Shipley Co., of Newton, Mass. Surface 31a of the substrate preferably is parallel to the plane of window 39 and both preferably are perpendicular to the optical axis 14' of the system. In practice, quarter-wave plate 28 was substituted for window 39 and served the dual function satisfactorily.

In order to minimize formation of optical standing waves in resist layer 42 during exposure and development of the mask pattern on the layer, liquid-gate 40 is selected to have an index of refraction $n_L$ which is closer to the index of refraction $n_R$ of the photoresist layer 42 than is the index of refraction of air (n=1.0). In addition to minimizing optical standing waves in the resist layer, this liquid-gate offers a secondary advantage of increased optical depth-of-focus which tends to relax focus precision requirements.

An extension of the feature of immersing the photoresist layer 42 in a medium having a similar index of refraction is the additional feature of utilizing photoresist developer liquid as that medium. The latter feature in combination with reflex viewing provided by viewer 24 enables composite expose/develop processing of positive photoresist with visual monitoring in real time, enabling the process to be terminated when complete regardless of the time interval required. Process control precision is optimized merely by making exposure levels sufficiently low that development of the photoresist layer can "keep up". Since the exposed resist layer is continually developing, any residual standing-wave pattern is dynamically changing, thereby further reducing adverse effects. A primary advantage of the technique of in-process monitoring, however, is that it virtually eliminates the need for tight control of resist thickness, pre-bake, and ageing.

By way of example, apparatus for and a method of practicing the invention has been completed and tested and has the following characteristics:

| Light source | mercury arc lamp |
|---|---|
| filtered wavelength | 4358 Å |
| Substrate | lithium niobate |
| Liquid-gate developer-solution | AZ-1350 |
| index of refraction $n_L$ | ≈1.33 |
| Photoresist layer composition | AZ-1350J |
| index of refraction $n_R$ | 1.65 |

Resist layers from 2,000 to 10,000 Å thick were routinely processed without concern for accurate control of absolute thickness or exposure time.

What is claimed is:

1. An optical system for exposing and developing a printed circuit photoresist layer having a thickness of approximately one micron, comprising
   a light source and a condenser lens and an objective lens and a substrate arranged in series along an optical axis,
   said substrate having a surface covered by said photoresist layer, said layer having an index of refraction $n_R$,
   a planar mask disposed transversely of said axis between said lenses, said mask having an image adapted to be optically projected by said light source onto said photoresist layer of the substrate,
   a transparent gate adjacent to the side of said layer opposite from the substrate, said gate comprising an optical window aligned with said axis and a liquid engaging said side of the layer and having an index of refraction $n_L$ closer to $n_R$ than the index of refraction of air and being characterized by the capability of photographically developing said photoresist layer upon exposure of the latter to said light source, said liquid being retained by said window,
   a beamsplitter comprising a partially-transmissive partially-reflective mirror disposed on said optical axis between said mask and said objective lens whereby a portion of the light from said source reflected from said substrate passes through said beamsplitter,
   a viewing device aligned with said optical axis and having an image viewing plane optically coplaner with the plane of the said mask, and
   said viewing device being positioned to receive the reflected light passing through said beamsplitter, said image viewing plane being optically spaced from said substrate by a distance equal to the optical spacing between said substrate and said mask.

* * * * *